United States Patent
Hosaka et al.

(10) Patent No.: US 9,343,470 B2
(45) Date of Patent: May 17, 2016

(54) INTEGRATION OF SEMICONDUCTOR MEMORY CELLS AND LOGIC CELLS

(71) Applicant: Cypress Semiconductor Corporation, San Jose, CA (US)

(72) Inventors: Kimihiko Hosaka, Tokyo (JP); Toro Anezaki, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/458,542

(22) Filed: Aug. 13, 2014

(65) Prior Publication Data

US 2016/0049416 A1    Feb. 18, 2016

(51) Int. Cl.
*H01L 29/66* (2006.01)
*H01L 27/115* (2006.01)
*H01L 21/28* (2006.01)

(52) U.S. Cl.
CPC .... *H01L 27/11524* (2013.01); *H01L 21/28008* (2013.01); *H01L 21/28273* (2013.01)

(58) Field of Classification Search
CPC .......................... H01L 27/115; H01L 27/11521
USPC .................... 257/316, 391; 438/588
See application file for complete search history.

(56) References Cited

U.S. PATENT DOCUMENTS

| | | | | |
|---|---|---|---|---|
| 5,960,270 A | * | 9/1999 | Misra | H01L 21/2257 257/E21.151 |
| 6,406,956 B1 | * | 6/2002 | Tsai | H01L 27/0629 257/E21.004 |
| 8,753,931 B2 | * | 6/2014 | Zhu | H01L 21/28088 257/369 |
| 2010/0065926 A1 | * | 3/2010 | Yeh | H01L 21/28105 257/410 |
| 2010/0087055 A1 | * | 4/2010 | Lai | H01L 21/823842 438/585 |
| 2012/0113726 A1 | * | 5/2012 | Huang | H01L 27/11556 365/185.27 |
| 2013/0264652 A1 | * | 10/2013 | Zhu | H01L 21/28088 257/369 |
| 2013/0302974 A1 | * | 11/2013 | Hahn | H01L 21/823842 438/585 |

FOREIGN PATENT DOCUMENTS

JP    2011-049282 A    3/2011

* cited by examiner

*Primary Examiner* — Jami M Valentine

(57) ABSTRACT

A polysilicon gate electrode is formed in a memory cell area, and a dummy polysilicon gate electrode is formed in a logic cell area of a silicon substrate. The dummy polysilicon gate electrode is removed and a gate insulation film and a metal gate electrode having a recess portion are formed. Further, contact holes are formed on source regions and drain regions of the memory cell area and the logic cell area. The recess portion of the metal gate electrode and the contact holes are filled with a wiring metal, substantially simultaneously, and thereafter the wiring metal is planarized by polishing.

11 Claims, 14 Drawing Sheets

INTEGRATION OF SEMICONDUCTOR MEMORY CELLS AND LOGIC CELLS

BACKGROUND

Technological developments related to the formation of a gate electrode using a metal gate electrode and a high dielectric constant (High-K) insulation film have been actively carried out in recent years in order to realize further high performance and low power consumption of a semiconductor device, especially a metal oxide semiconductor field effect transistor (MOSFET). With the adoption of such a gate stack, gate depletion that may occur at conventional polysilicon gate electrode is suppressed and a leak current (gate tunnel leak current) caused by quantum tunnel effect is reduced. As a result, a drive current of the MOSFET may be increased and switching speed of semiconductor circuit may be increased.

Japanese Patent Application No. 2011-49282 (refer to FIG. 1 to FIG. 19) is one example, wherein a method is described for manufacturing a semiconductor device having on the same substrate, a metal-oxide-nitride-oxide-silicon (MONOS) (e.g., a metal/silicon oxide film/silicon nitride film/silicon oxide film/silicon) type nonvolatile memory relatively excellent in reliability, a high voltage metal insulator semiconductor field effect transistor (MISFET), and a low voltage MISFET using a metal gate and a High-K insulation film in a gate structure. In this method, cell structures of the MONOS-type nonvolatile memory and the high voltage MISFET, and an opening for a metal gate electrode of the low voltage MISFET are formed, and thereafter a metal film that serves as a metal gate is deposited on these. Then, the metal film is polished chemically and mechanically (i.e., chemical mechanical polishing (CMP)) to form a metal gate electrode as exposed. Thereafter, contact plugs each connected to the source and drain of each transistor are formed, and further a wiring layer and an interlayer insulation film are formed thereon by the known Damascene process.

However, when the metal gate electrode is formed in such a conventional method, a difference locally occurs in polishing amount due to a difference in pattern density between various cell areas (e.g., a memory cell area and a logic cell area) upon subjecting the metal film to CMP. As a result, there is a possibility that the flatness of a substrate surface (in a substrate plane) will be damaged, and if the contact plugs are formed thereafter, the desired performance and reliability of a resulting product cannot be achieved. If further miniaturization is desired, the influence of such deterioration in planarity can be more remarkable.

SUMMARY

Provided herein are a semiconductor device and a manufacturing method capable of preventing deterioration in the flatness of a substrate surface due to a difference in pattern density between a memory cell area and a logic cell area, and realizing high performance and high reliability without damaging the soundness of a cell structure.

An embodiment includes a method for manufacturing a semiconductor device having a memory cell area and a logic cell area. The method comprises preparing a silicon substrate, forming a polysilicon gate electrode in the memory cell area, forming a dummy polysilicon gate electrode in the logic cell area, removing the dummy polysilicon gate electrode from the logic cell area, forming a gate insulation film and a metal gate electrode having a recess portion, in place of the removed dummy polysilicon gate electrode, forming contact holes on source regions and drain regions of the memory cell area and the logic cell area, filling the recess portion of the metal gate electrode and the contact holes with the same wiring metal, substantially simultaneously, and planarizing the wiring metal by polishing. Also, specifically, for example, etching may be used to expose the gate top surface of the dummy polysilicon gate electrode.

Another embodiment includes a semiconductor device, which comprises a memory cell area on a silicon substrate, which is formed with a polysilicon gate electrode therein; a logic cell area on the silicon substrate, which is formed with a gate insulation film and a metal gate electrode having a recess portion therein; and contact holes formed on source regions and drain regions of the memory cell area and the logic cell area. The recess portion of the metal gate electrode and the contact holes are filled with the same wiring metal. The gate top surface of the metal gate electrode, which includes the portion filled with the wiring metal, is higher than the gate top surface of the polysilicon gate electrode in terms of height from the surface of the silicon substrate.

BRIEF DESCRIPTION OF THE DRAWINGS

The accompanying drawings are incorporated herein and form a part of the specification.

In the drawings, like reference numbers generally indicate identical or similar elements. Additionally, generally, the leftmost digit(s) of a reference number identifies the drawing in which the reference number first appears.

DETAILED DESCRIPTION

A method for manufacturing a semiconductor device according to one embodiment will be described below with reference to FIG. 1 through FIG. 27. The semiconductor device manufactured by the manufacturing method according to the present embodiment has a memory cell area AM of, for example, a buried flash memory 100 (memory cell), and a logic cell area AL of, for example, a negative-channel MOSFET (NMOSFET) 200 and a positive-channel MOSFET (PMOSFET) 300. NMOSFET 200 and PMOSEFT 300 are both logic cells.

In the following description, the known suitable physical and/or chemical techniques can be applied to various processes such as film deposition and patterning or the like conducted in respective processes, unless otherwise specified.

Figure 1:
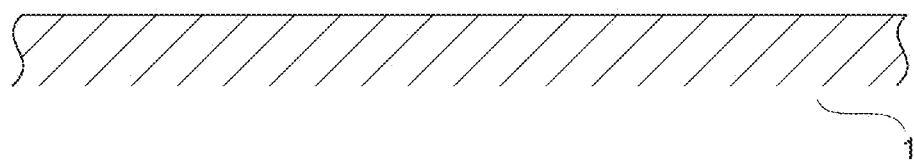
FIG. 1 through FIG. 27 are process flow diagrams each illustrating a stage during the manufacturing of a semiconductor device according to an embodiment.
Figure 2:
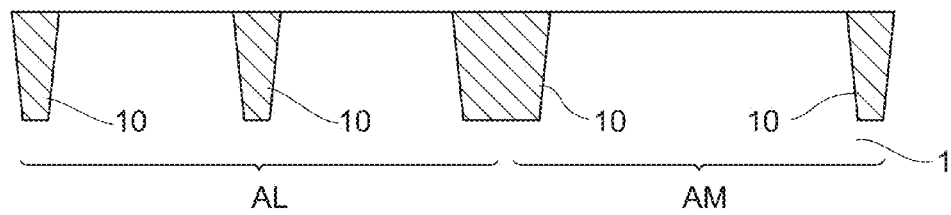
Figure 3:
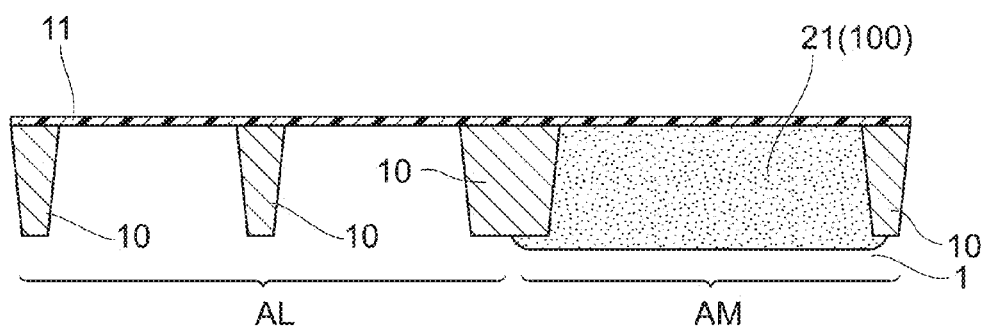

Here, a p-type silicon substrate 1 is first prepared (refer to FIG. 1), and element isolation is performed thereon by the known element isolation technique such as shallow trench isolation (STI) or the like (refer to FIG. 2). The thickness of an insulative isolating film 10 in the STI is, for example, approximately 300 nm or less. Next, a sacrificial layer 11 (e.g., about 10-nm thick or less) is formed over the silicon substrate 1. With the sacrificial layer 11 as a protective film, ions are implanted into the memory cell area AM (e.g., boron: $1.0 \times 10^{14}$ $cm^{-2}$ at 100 keV) to form a well 21 (refer to FIG. 3).

Figure 4:
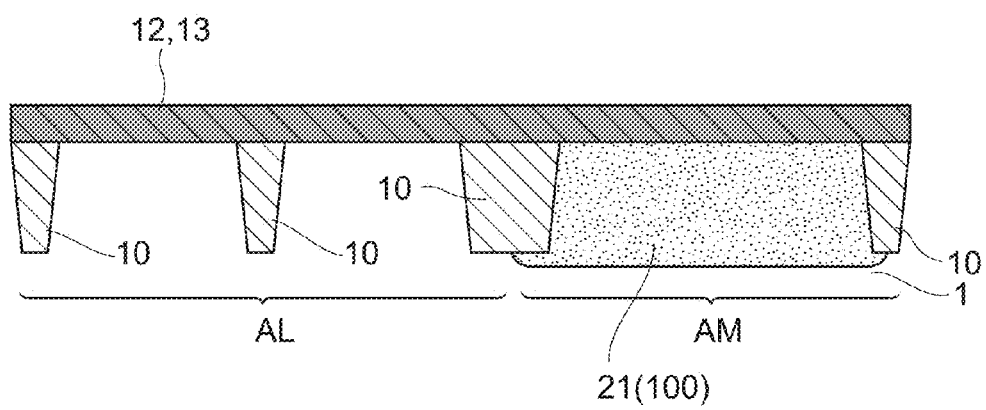

Then, the sacrificial layer 11 is removed, and a tunnel oxide film 12 (e.g., about 10-nm thick or less) and a doped amorphous silicon film 13 (e.g., about 100-nm thick or less) for forming a floating gate 101 of the flash memory 100 are sequentially formed (refer to FIG. 4). Next, the tunnel oxide film 12 and the doped amorphous silicon film 13 are subjected to patterning, by which a portion that serves as the floating gate 101 is left above the well 21 of the memory cell area AM (refer to FIG. 5).

Figure 5:
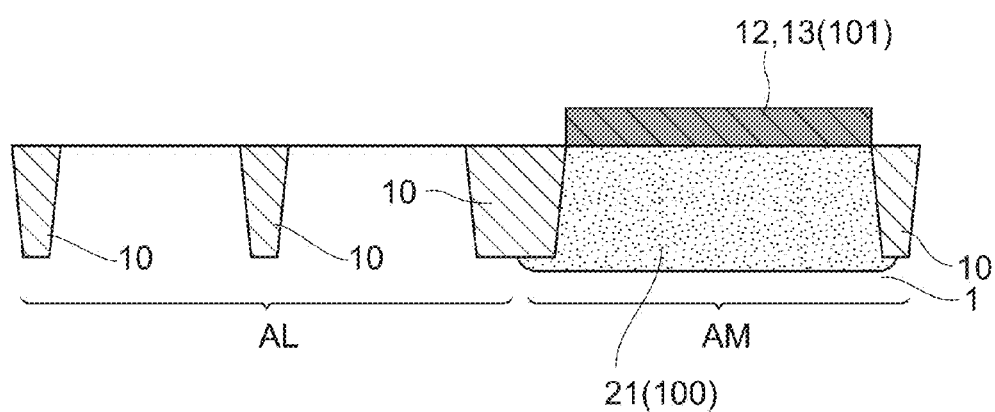

Further, a silicon oxide film/silicon nitride film/silicon oxide film (ONO) film 14 is deposited to cover the side surface of the tunnel oxide film 12, the side and upper surfaces of the doped amorphous silicon film 13 and the surface of the silicon substrate 1, which are shown in FIG. 5. Next, with the ONO film 14 as a protective film, ion implantation (e.g., boron: $3.0 \times 10^{13}$ cm$^{-2}$ at 100 keV) for forming a well 22 of the NMOSFET 200 in the logic cell area AL is conducted. Also, likewise, with the ONO film 14 as the protective film, ion implantation (e.g., phosphorus: $3.0 \times 10^{13}$ cm$^{-2}$ at 300 keV) for forming a well 23 of the PMOSFET 300 in the logic cell area AL is conducted. Thereafter, a well anneal is conducted (refer to FIG. 6).

Figure 6:
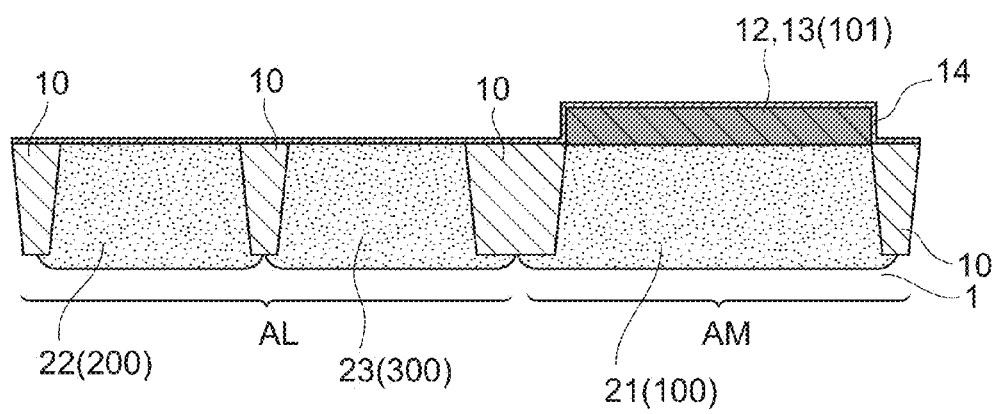

Next, the ONO film 14 on the logic cell area AL in FIG. 6 is removed, and a gate oxide film 31 is deposited on the logic cell area AL. Further, a polysilicon film 32 (e.g., about 100-nm thick or less), and a hard mask 33 (e.g., a SiN film of about 30-nm thick or less) are sequentially deposited on the silicon substrate 1 (refer to FIG. 7). Here, the polysilicon film 32 on the memory cell area AM serves as a control gate 102 of the flash memory 100 later. Further, the polysilicon film 32 on the logic cell area AL constitutes respective dummy polysilicon gate electrodes 210 and 310 of the NMOSFET 200 and the PMOSFET 300 later.

Figure 7:
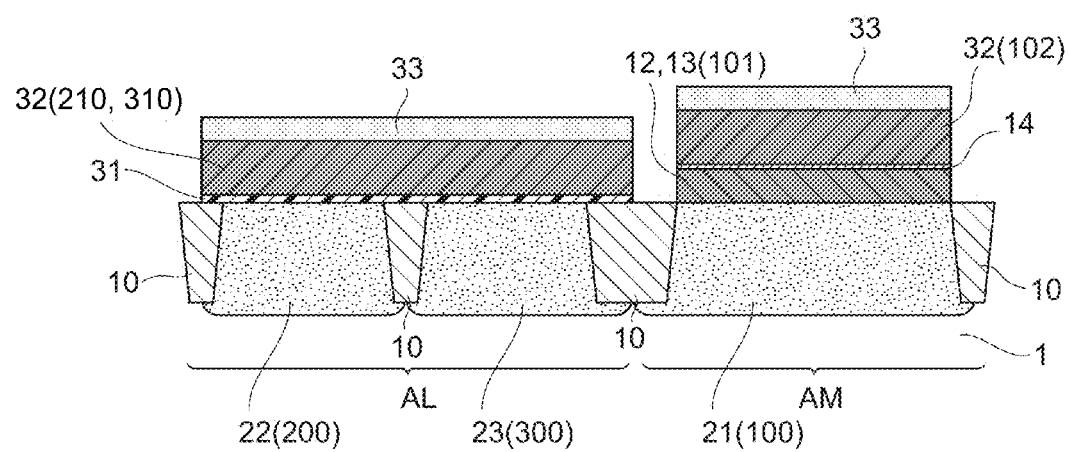
Figure 8:
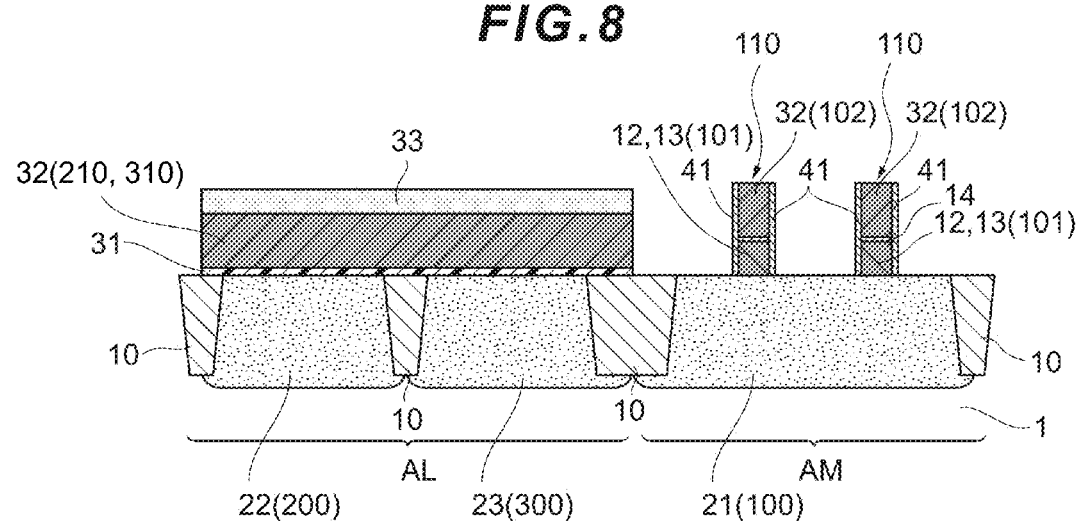
Figure 9:
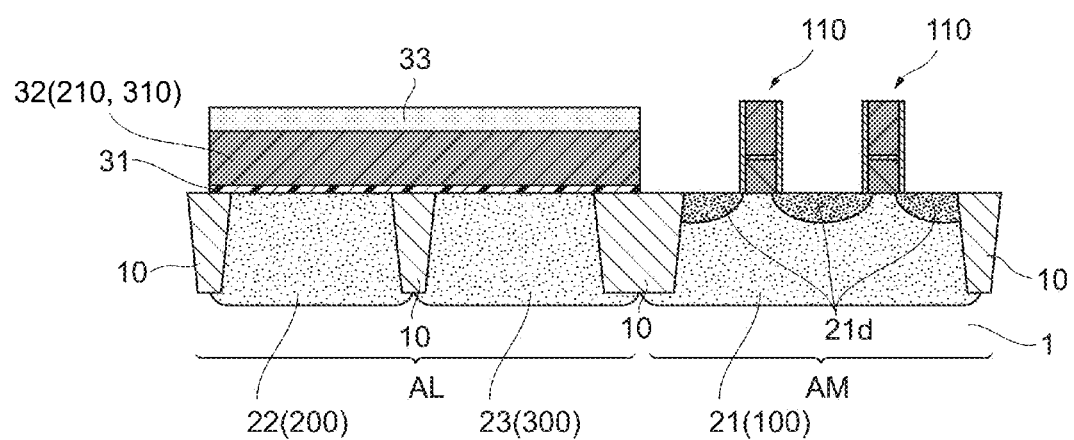
Figure 10:
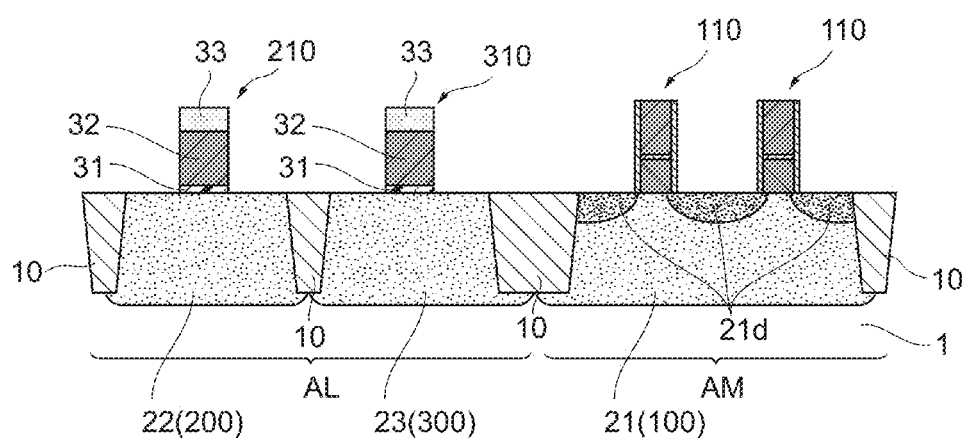

Next, patterning of the structure on the memory cell area AM is performed from a state shown in FIG. 7 to remove the hard mask 33. Further, an offset spacer 41 (e.g., SiO$_2$ film of about 30-nm thick or less) is formed on the side surfaces of the patterned tunnel oxide film 12, doped amorphous silicon film 13, ONO film 14 and polysilicon film 32. Thus, a basic structure of each polysilicon gate electrode 110 of the flash memory 100 is obtained (refer to FIG. 8).

Then, ion implantation (e.g., arsenic: $5.0 \times 10^{14}$ cm$^{-2}$ at 50 keV) for forming lightly doped drain (LDD) region 21*d* in the well 21 of the memory cell area AM is conducted (refer to FIG. 9). Next, patterning of the structure on the logic cell area AL is performed from a state shown in FIG. 9 to thereby obtain a basic structure of each of the dummy polysilicon gate electrode 210 of the NMOSFET 200 and the dummy polysilicon gate electrode 310 of the PMOSFET 300 (refer to FIG. 10). At this time, the hard mask 33 above the dummy polysilicon is not removed.

Figure 11:
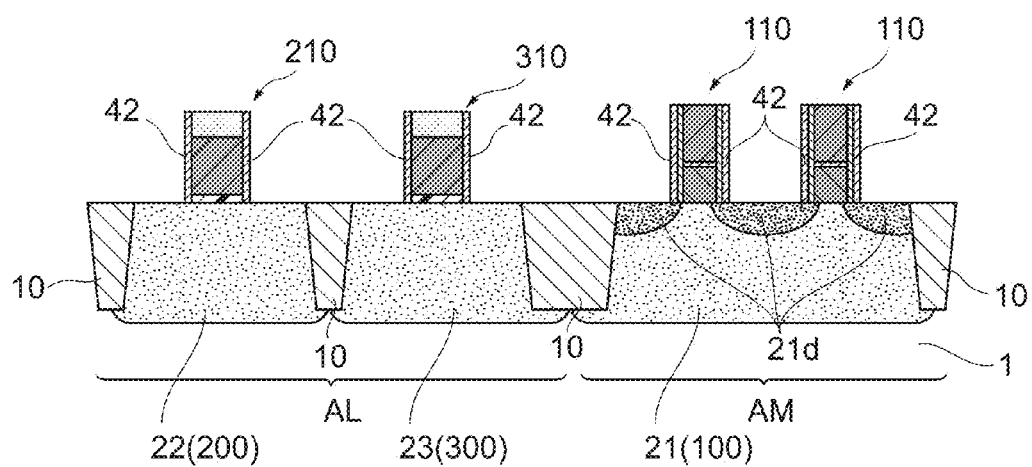
Figure 12:
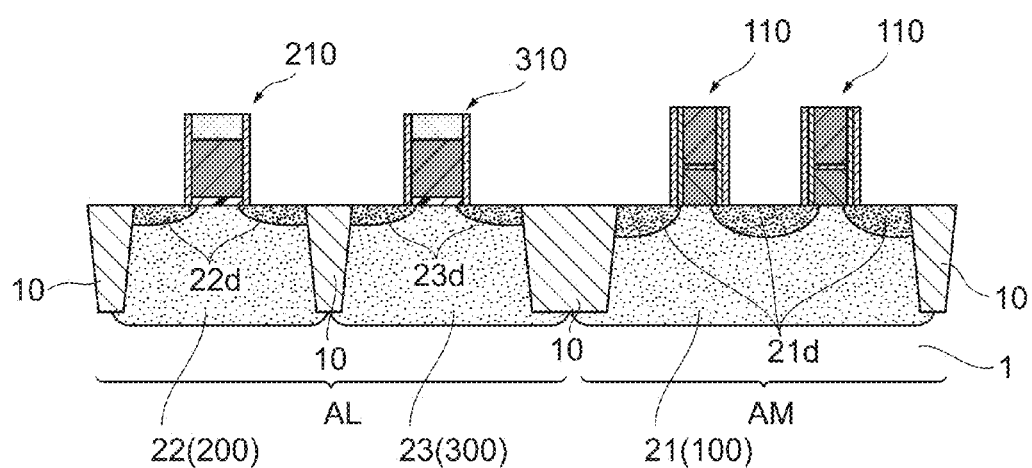

Further, as needed, a further offset spacer 42 (e.g., SiO$_2$ film of about 10-nm thick or less: principally used for logic cell) is formed on the side surface of each of the basic structures of the polysilicon gate electrodes 110 of the flash memory 100, the dummy polysilicon gate electrode 210 of the NMOSFET 200 and the dummy polysilicon gate electrode 310 of the PMOSFET 300 (refer to FIG. 11).

Next, ion implantation (e.g., arsenic: $1.0 \times 10^{15}$ cm$^{-2}$ at 3 keV) for forming an LDD region 22*d* in the well 22 of the NMOSFET 200 in the logic cell area AL is conducted. Also, ion implantation (e.g., boron: $5.0 \times 10^{14}$ cm$^{-2}$ at 1 keV) for forming an LDD region 23*d* in the well 23 of the PMOSFET 300 in the logic cell area AL is conducted (refer to FIG. 12).

Figure 13:
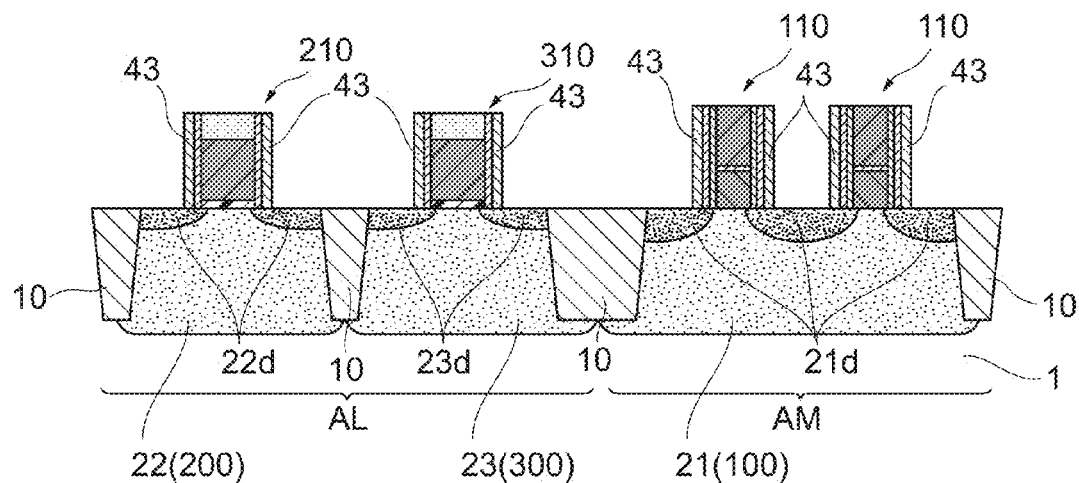
Figure 14:
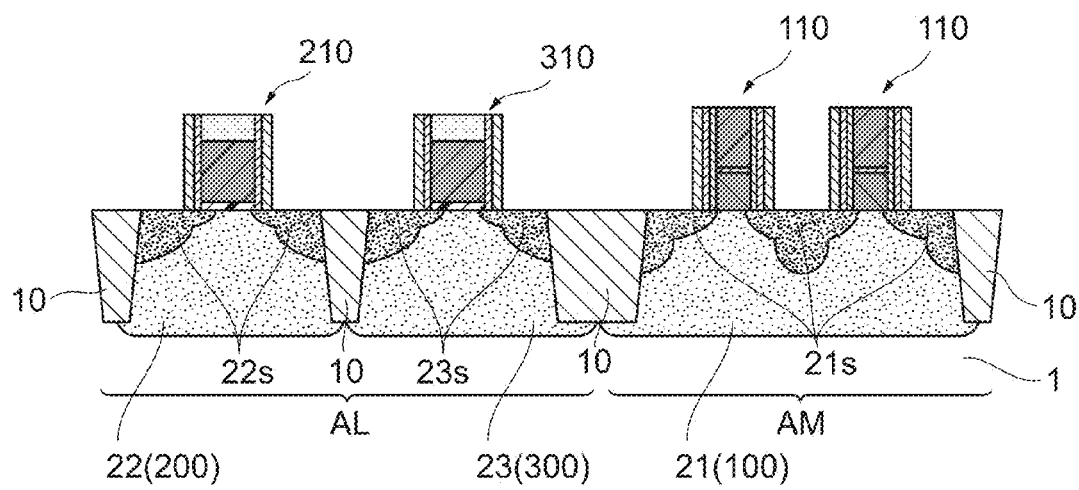

Then, a sidewall 43 (e.g., SiO$_2$ film of about 50-nm thick or less) is formed on the side surface of the offset spacer 42 in the basic structure of each of the polysilicon gate electrode 110, the dummy polysilicon gate electrode 210 and the dummy polysilicon gate electrode 310 (refer to FIG. 13).

Then, ion implantation (e.g., phosphorus: $1.0 \times 10^{16}$ cm$^{-2}$ at 8 keV) is performed on the LDD region 21*d* in the well 21 of the flash memory 100 and the LDD region 22*d* in the well 22 of the NMOSFET 200. Also, likewise, an ion implantation (e.g., boron: $5.0 \times 10^{15}$ cm$^{-2}$ at 4 keV) is performed on the LDD region 23*d* in the well 23 of the PMOSFET 300. Thereafter, an activation anneal is performed to form source and drain (SD) regions 21*s*, 22*s* and 23*s* (refer to FIG. 14). Incidentally, the previously pattern-formed dummy polysilicon gate electrode in the logic cell area AL serves as a structure useful for forming the LDD and SD regions.

And then, a metal silicide film 44 for low resistance is formed on the SD region 21*s* in the memory cell area AM, the polysilicon film 32 (control gate) of each polysilicon gate electrode 110 and the SD regions 22*s* and 23*s* in the logic cell area AL. In an embodiment, a Co film of, for example, 10 nm or so and a TiN film of, for example, 30 nm or so are formed on the corresponding portion and thereafter rapid thermal anneal (RTA) is performed thereon at, for example, 700° C. for 30 seconds to thereby bring the portion into silicidation. Thus, a CoSi$_2$ film is formed as the metal silicide film 44 (refer to FIG. 15). At this time, since the dummy polysilicon gate electrodes 210 and 310 on the NMOSFET 200 and the PMOSFET 300 in the logic cell area AL are covered with the hard mask, no silicidation is done. Incidentally, Ni and Ti may be also used as a silicide material depending on a desired resistance value or temperature resistance. An RTA condition for that case is set to a condition suitable for the formation of the metal silicide film based on them.

Figure 15:
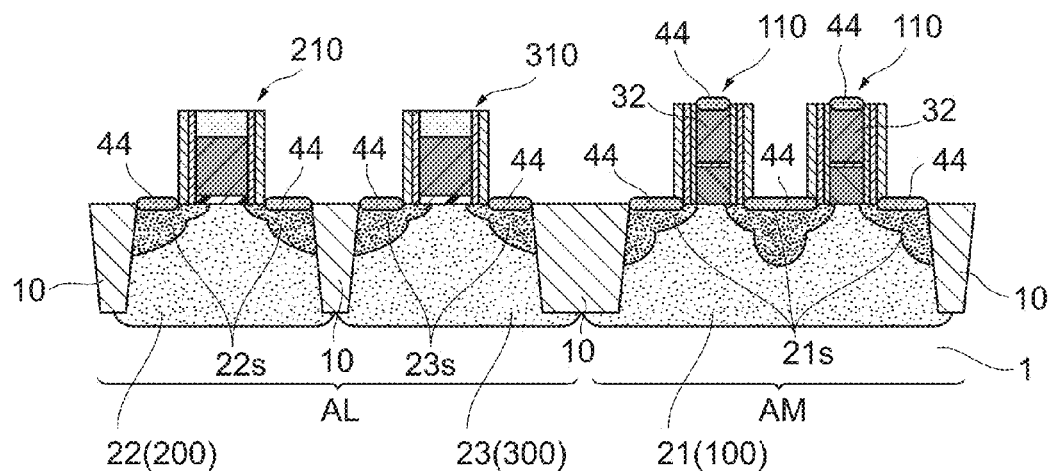
Figure 16:
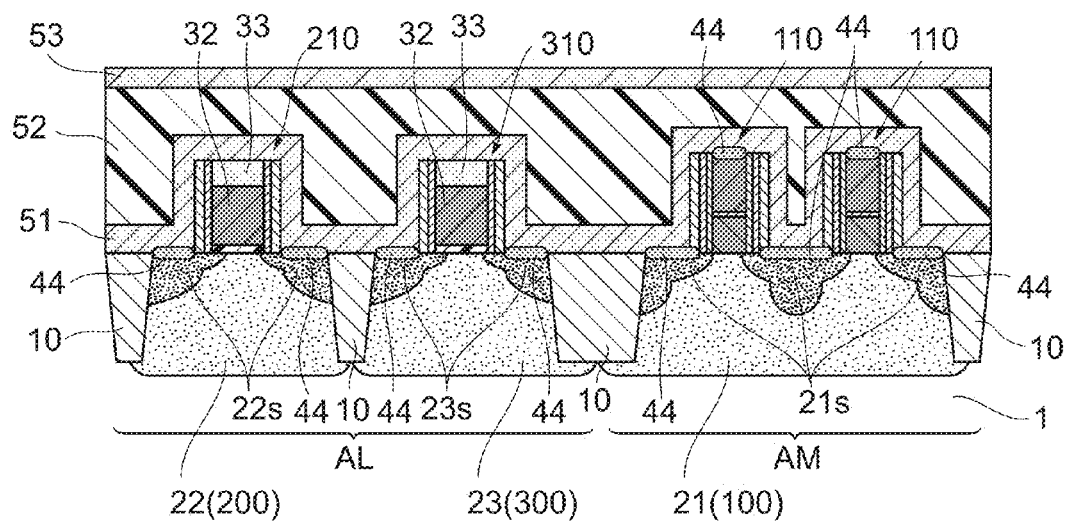
Figure 17:
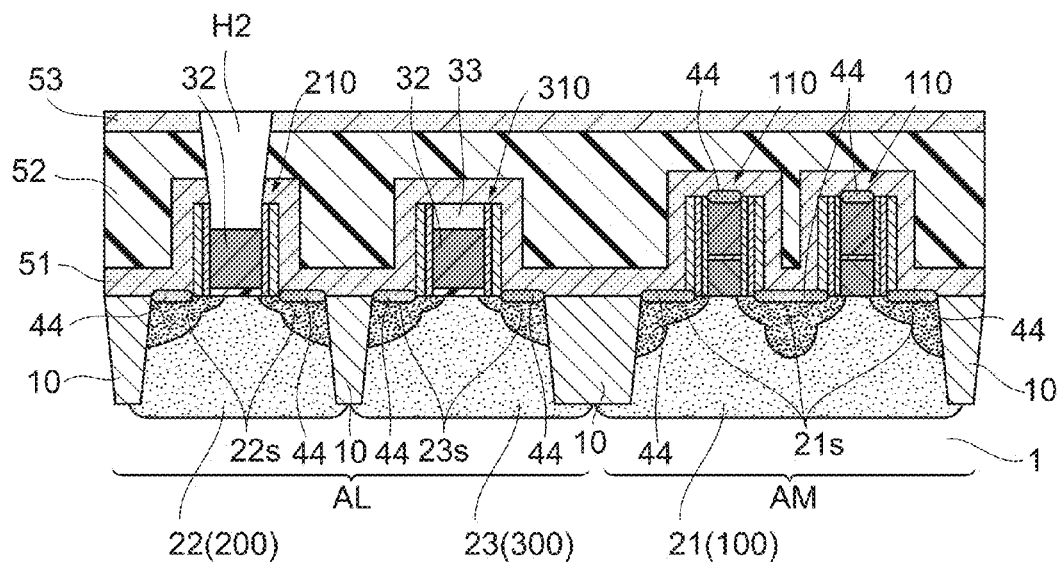
Figure 18:
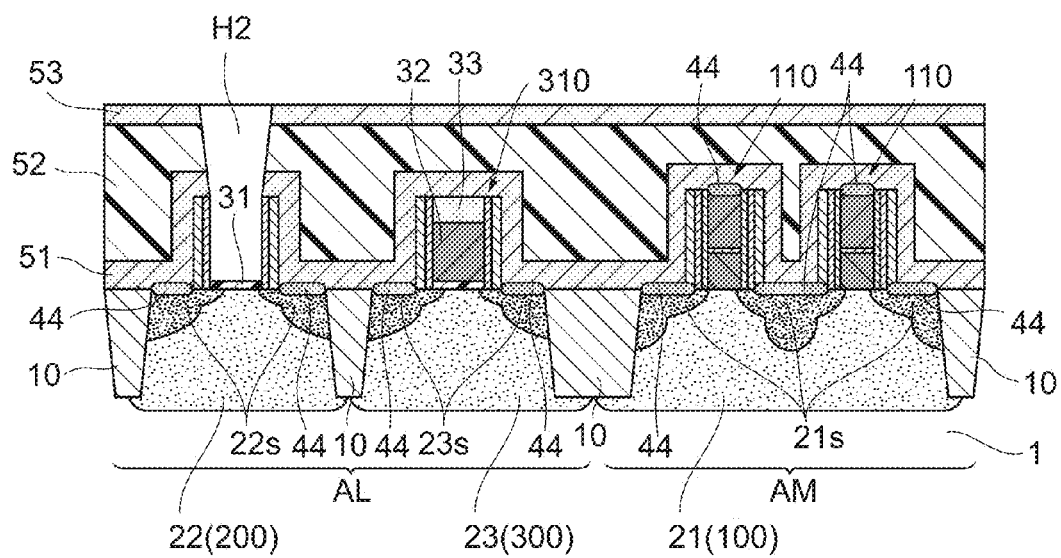

Next, a contact etch stop layer (CESL) 51 (for example, SiN film of about 50 nm or less) is deposited along the side and upper surfaces of the polysilicon gate electrode 110 and the dummy polysilicon gate electrodes 210 and 310 in a state shown in FIG. 15, while covering the exposed surface of the silicon substrate 1 and the metal silicide film 44. For example, a SiO film of about 500-nm thick or less is formed on the CESL 51 and subjected to planarization to thereby form an interlayer dielectric (ILD) 52. Further, a hard mask 53 (for example, SiN film of about 30-nm thick or less) is formed on the ILD 52 (refer to FIG. 16).

Next, photolithography and etching are performed on the portion of the dummy polysilicon gate electrode 210 in the forming area of the NMOSFET 200 in the logic cell area AL. Thus, the hard mask 53, the ILD 52 and the CESL 51 related to the portion are sequentially removed. Further, the gate top hard mask 33 is removed (refer to FIG. 17). The polysilicon film 32 that serves as the dummy polysilicon gate electrode 210, which is exposed within a hole H2, is removed by wet etching, for example (refer to FIG. 18). Consequently, the gate oxide film 31 is exposed within the hole H2.

Figure 19:
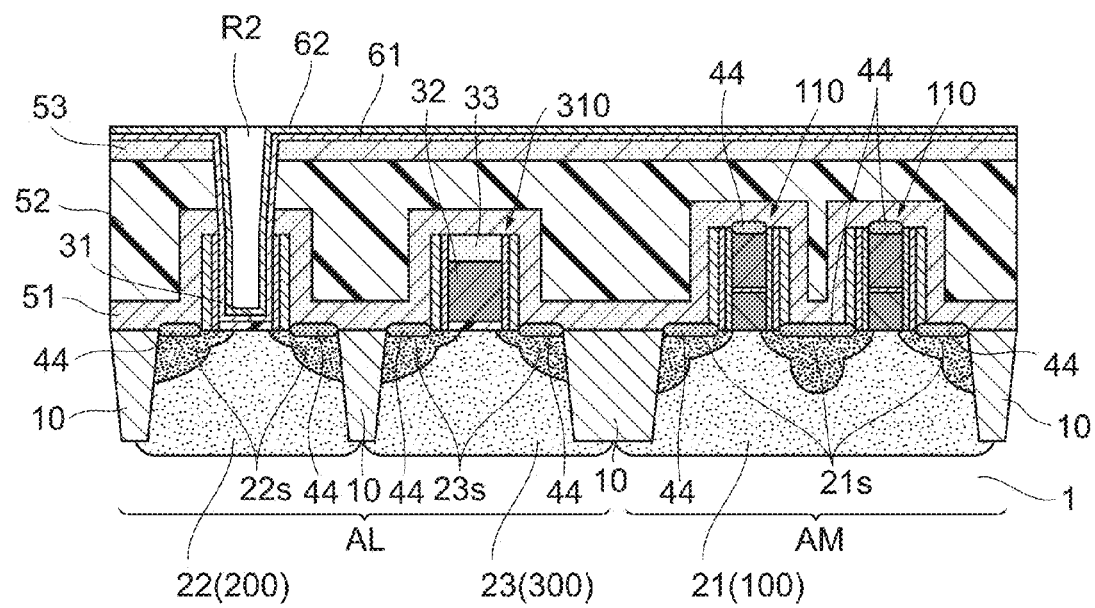

Next, a gate insulation film 61 (High-K insulation film or the like) of NMOSFET 200, and a metal film 62 that serves as a metal gate electrode are deposited on the silicon substrate 1 including the inside of the hole H2 by one or more of a CVD method, an ALD method, and a PVD method such as sputtering (refer to FIG. 19). As the gate insulation film 61, for example, HfO$_2$, HfON and HfSiON (there is also a case where Zr may be added to these), TaO$_5$, etc. may be used. The thickness of the gate insulation film 61 can be set to about 3 nm or less, for example. However, the conventional silicon oxide film, silicon oxynitride film, etc. may also be used as the gate insulation film formed herein. Further, as the metal film 62, for example, TiAlN, TiN, TaN, TaC, TaCN, W, etc., may be used. The thickness of the metal film 62 is set to about 5 nm or less, for example. Thus, a recess portion R2 is defined in which the inner walls (side and bottom walls) of the hole H2 are covered with the gate insulation film 61 and the metal film 62.

Figure 20:
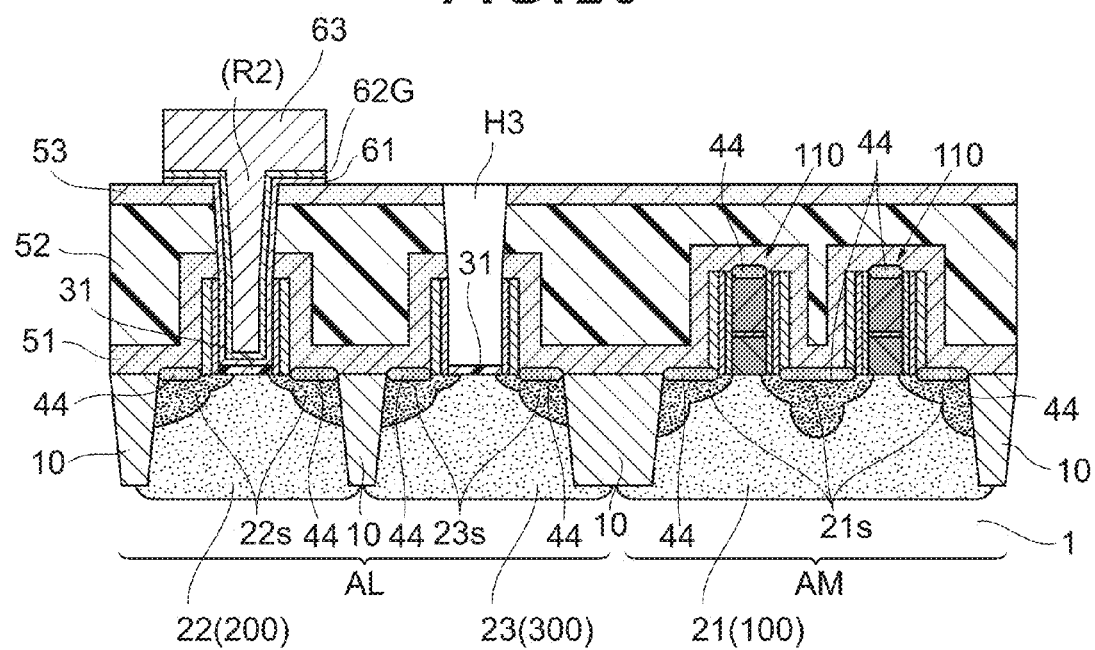

Next, a protective film 63 (e.g., SiO film) is formed on the metal film 62 provided inside the recess portion R2 and around (i.e., the logic cell area AL of the NMOSFET 200) the opening edge thereof (refer to FIG. 20). Etching is done in this state to sequentially remove the metal film 62 and the gate insulation film 61 of the portion unformed with the protective film 63. Consequently, a metal gate electrode 62G having the recess portion R2, which is formed on the gate insulation film 61 in the NMOSFET 200, is obtained.

Further, photolithography and etching are performed on the portion of the dummy polysilicon gate electrode 310 in the logic cell area AL of the PMOSFET 300. Thus, the hard mask 53, the ILD 52, the CESL 51, the gate top hard mask 33 and the polysilicon film 32 formed as the dummy polysilicon gate electrode 310 related to the portion are removed (refer to FIG. 20). Consequently, the gate oxide film 31 is exposed within a hole H3.

Figure 21:
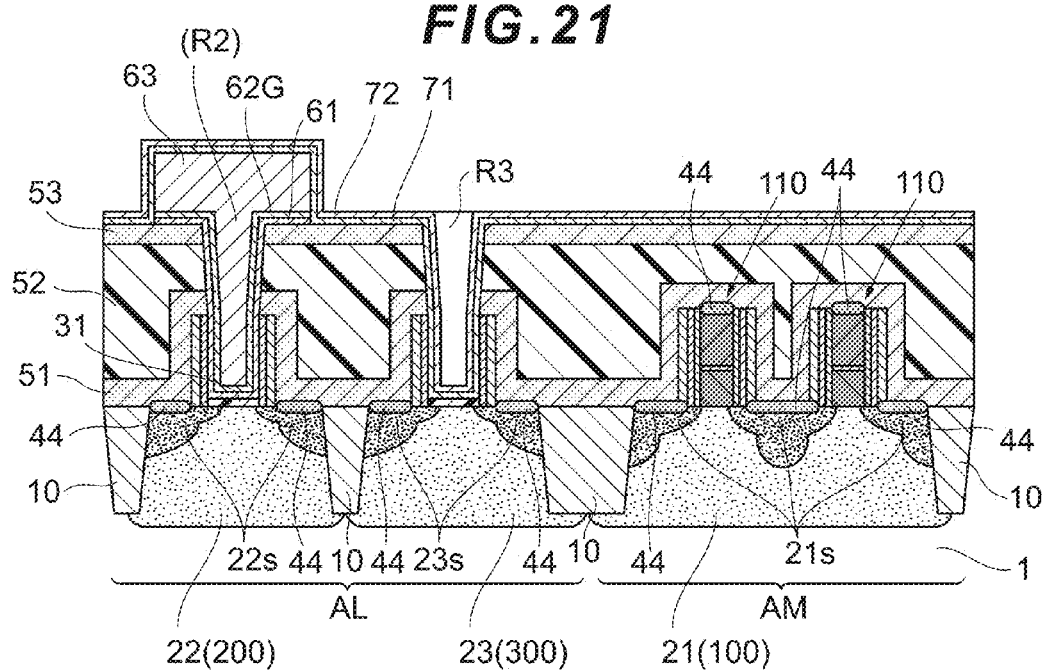

And then, a gate insulation film 71 (High-K insulation film or the like) for the PMOSFET 300, and a metal film 72 that serves as a metal gate are deposited inside the hole H3 and on the silicon substrate 1 including the protective film 63 by, for example, one or more of the CVD method, the ALD method, and the PVD method such as sputtering (refer to FIG. 21). As the gate insulation film 71, the same kind of materials as the aforementioned gate insulation film 61, i.e., for example, $HfO_2$, HfON and HfSiON (there is also a case where Zr may be added to these), $TaO_5$, etc. may be used. The thickness of the gate insulation film 71 can be set to about 3 nm or less, for example. However, the conventional silicon oxide film, silicon oxynitride film, etc. may also be used as the gate insulation film formed herein. Further, as the metal film 72, the same kind of materials as the aforementioned metal film 62, i.e., for example, TiAlN, TiN, TaN, TaC, TaCN, W, etc., may be used. The thickness of the metal film 72 is set to about 5 nm or less, for example. Thus, a recess portion R3 is defined in which the inner walls (side and bottom walls) of the hole H3 are covered with the gate insulation film 71 and the metal film 72.

Figure 22:
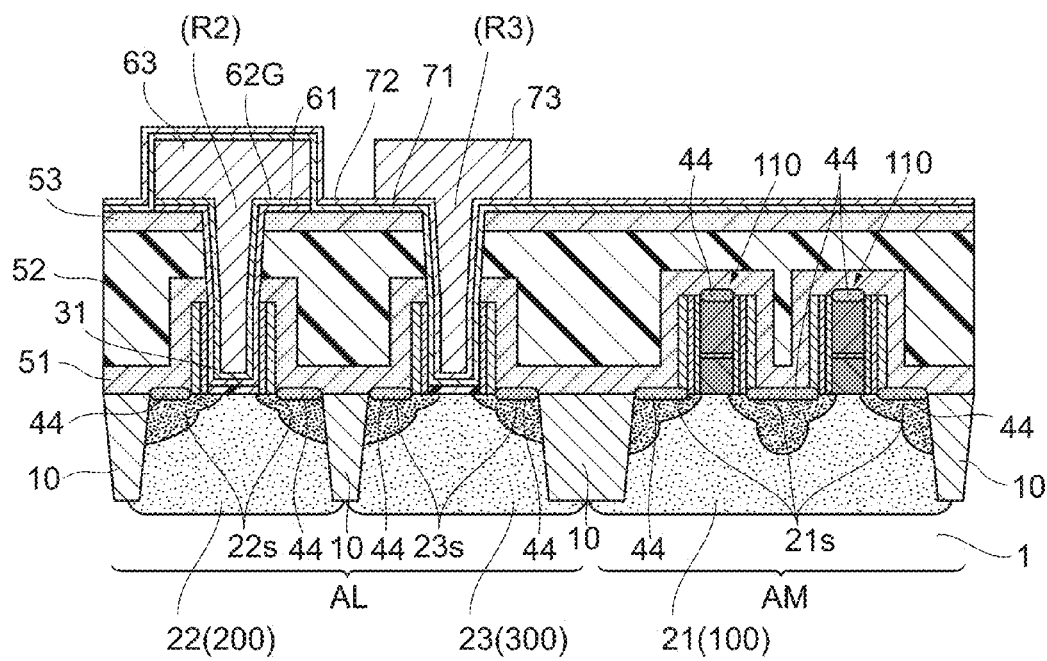
Figure 23:
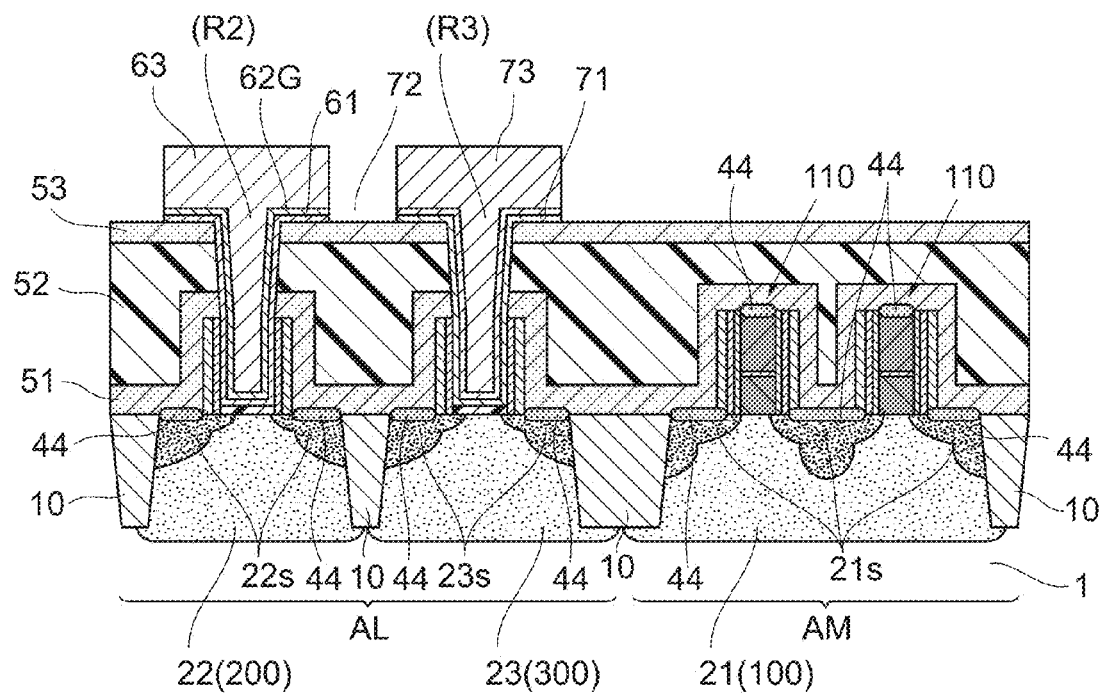
Figure 24:
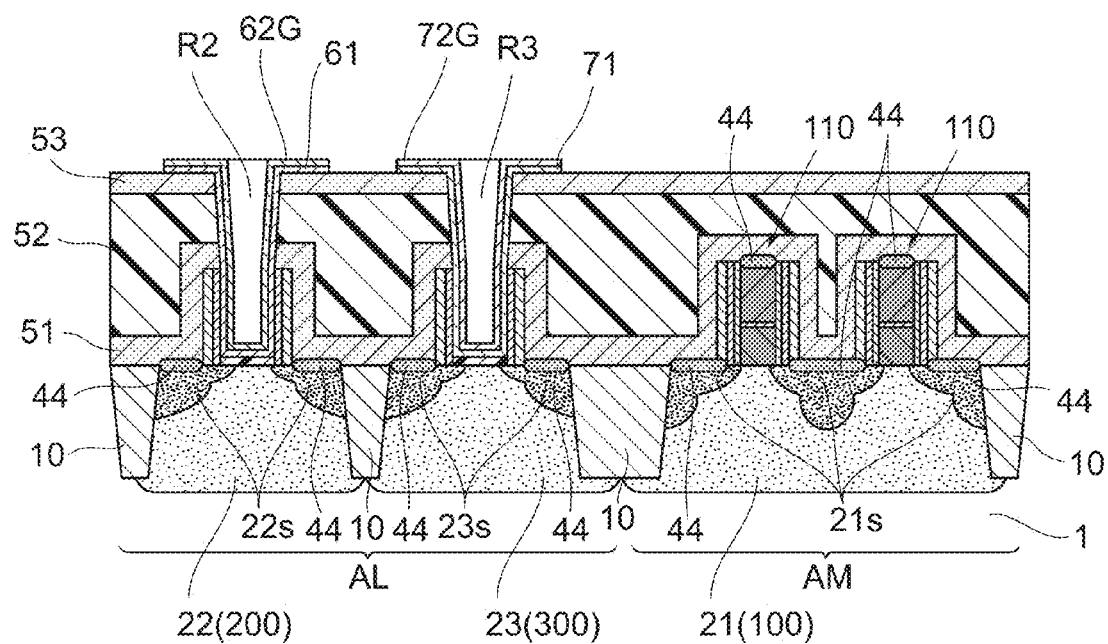

Next, a protective film 73 (e.g., SiO film) is formed on the metal film 72 provided inside the recess portion R3 and around (i.e., the logic cell area AL of the PMOSFET 300) the opening edge thereof (refer to FIG. 22). And etching is done in this state to sequentially remove the metal film 72 and the gate insulation film 71 of the portion unformed with the protective film 73 (Refer to FIG. 23). Consequently, a metal gate electrode 72G having the recess portion R3, which is formed on the gate insulation film 71 in the PMOSFET 300, is obtained. From that state, the protective films 63 and 73 are further removed using, for example, wet etching or the like to open the recess portions R2 and R3 again (refer to FIG. 24).

Figure 25:
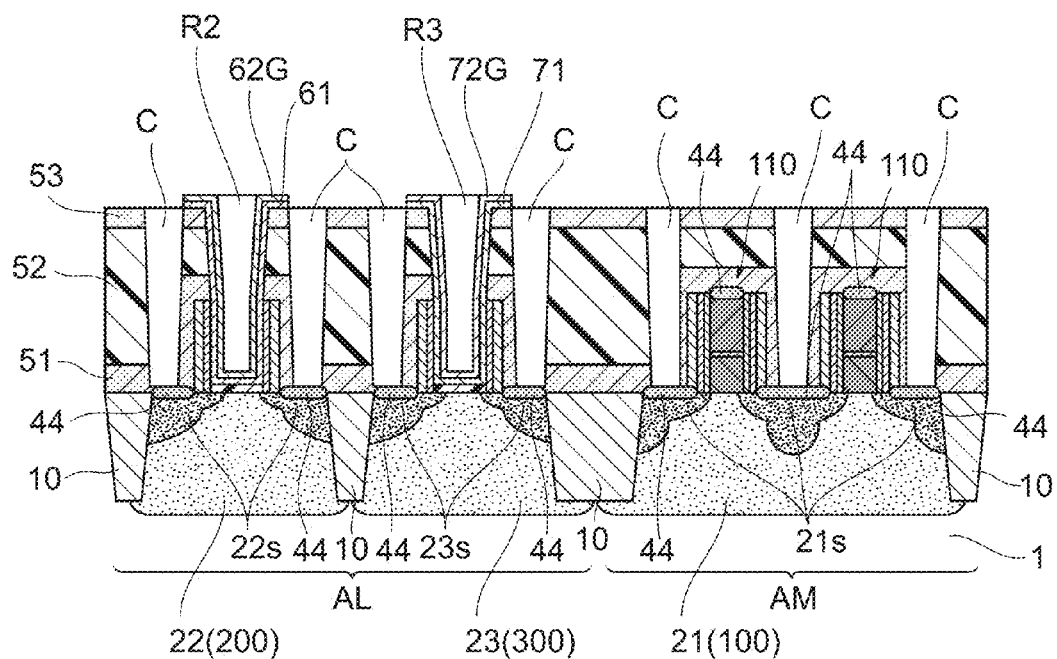

Next, photolithography and etching are performed to form contact holes C on the metal silicide film 44 formed in the SD regions 21s, 22s and 23s in the forming areas of the flash memory 100, the NMOSFET 200 and the PMOSFET 300 (refer to FIG. 25). Further, a barrier metal film 81 is deposited on the silicon substrate 1 including those contact holes C, the inner walls (side and bottom walls) of the recess portions R2 and R3 of the metal gate electrodes 62G and 72G. Thereafter, a metal film 82 is further deposited on the barrier metal film 81. Thus, the contact holes C and the recess portions R2 and R3 are filled with a metal for the metal film 82 (refer to FIG. 26).

Here, the barrier metal film 81 is for preventing the metal for the metal film 82 from being diffused into the insulation film due to migration or the like. As the barrier metal film 81, for example, Ti/TiN, Ta, etc. may be used. The metal film 82 is not particularly restricted so long as it is a metal capable of realizing decreasing the resistance of the contact and gate and hard to pass through the barrier metal film 81. For example, W, Al, Cu, etc. may be used.

Figure 26:
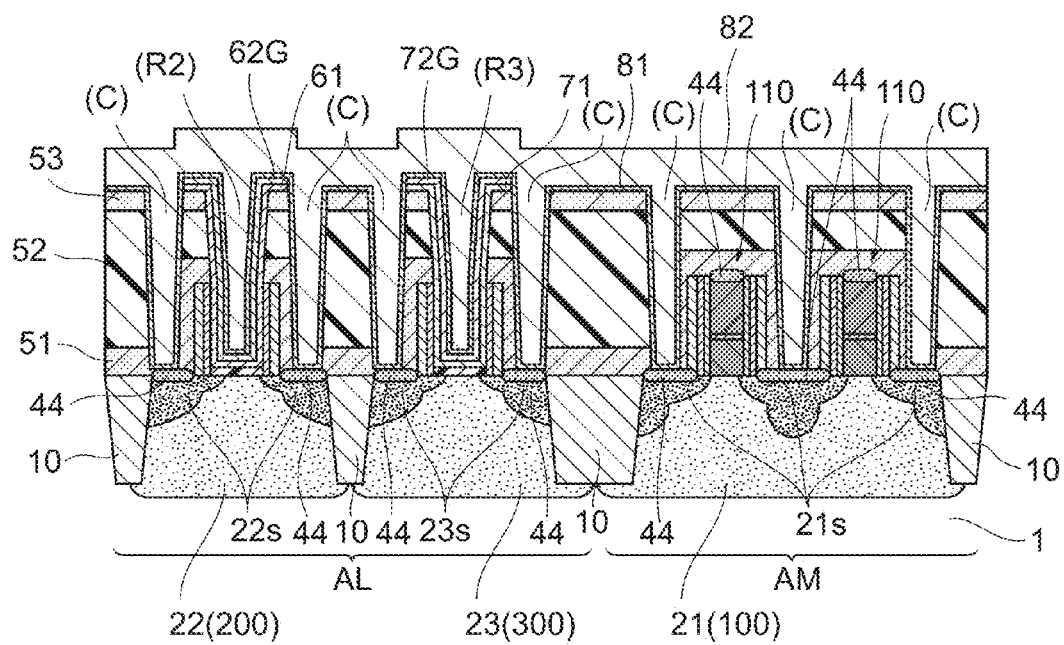
Figure 27:
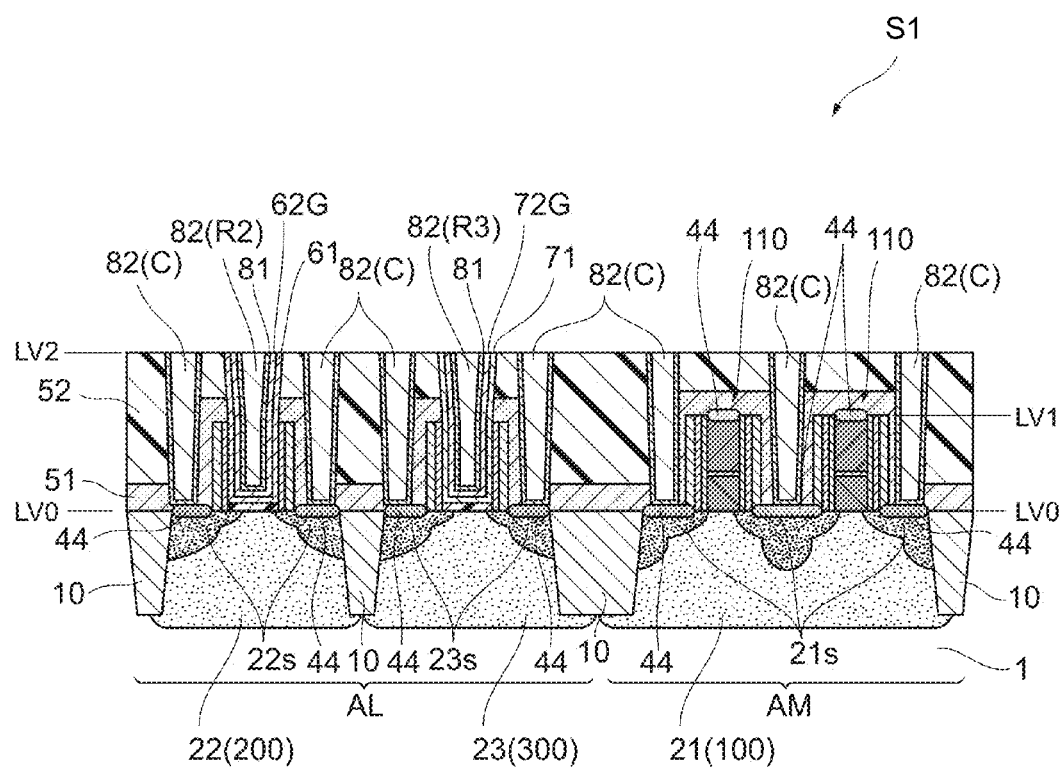

Then, CMP is performed on the silicon substrate 1 held in the state shown in FIG. 26 to planarize the surface of the substrate, whereby the structure of a semiconductor device S1 in which the metal film 82 is embedded into all of the recess portion R2 of the metal gate electrode 62G of the NMOSFET 200, the recess portion R3 of the metal gate electrode 72G of the PMOSFET 300, and the contact holes C is obtained (refer to FIG. 27).

Here, as shown in FIG. 27, in the semiconductor device S1 obtained in the aforementioned procedure, the height (distance between a level LV0 of the surface of the silicon substrate 1 and a level LV2 of the surface to be polished by CMP) of the gate top surface of each of the metal gate electrodes 62G and 72G including the portions filled with the wiring metals (barrier metal film 81 and metal film 82) is set higher (larger) than the height (distance between the level LV0 of the surface of the silicon substrate 1 and a level LV1 shown in FIG. 27) of each of the gate top surfaces of the polysilicon gate electrodes 110.

According to the semiconductor device S1 constituted in this manner and its manufacturing method, the polysilicon gate electrodes 110 of the flash memory 100 (memory cell) are formed, and a so-called substitution gate technique for substituting the temporarily formed dummy polysilicon gate electrodes 210 and 310 by the gate structures having the gate insulation films 61 and 71 and the metal gate electrodes 62G and 72G is applied to the NMOSFET 200 and the PMOSFET 300 (logic cells).

Further, after the gate structure of the flash memory 100 and the gate structures of the NMOSFET 200 and the PMOSFET 300 such as described above are formed, the contact holes C are provided over the forming areas (memory cell area AM and logic cell area AL). Then, the same wiring metals (barrier metal film 81 and metal film 82) are simultaneously filled in the contact holes C and the recess portions R2 and R3 of the metal gate electrodes 62G and 72G to form metal wiring patterns, followed by subjecting the thus-obtained structure to CMP, whereby the silicon substrate 1 is planarized.

Accordingly, since there is almost no difference in pattern density between the memory cell area AM and the logic cell area AL upon execution of CMP, it is possible to sufficiently prevent deterioration in in-substrate planarity in the CMP process due to the difference in pattern density assumed in the conventional method. As a result, since it is possible to sufficiently and highly hold machining accuracy in a process after the CMP process, high performance and reliability of the semiconductor device S1 can be realized without damaging the soundness of the cell structure.

The contact holes C and the recess portions R2 and R3 of the metal gate electrodes 62G and 72G are filled with the same wiring metal (barrier metal film 81 and metal film 82), substantially simultaneously, followed by being collectively planarized by CMP, whereby the contact metal-based wiring structure is formed. This is therefore suitable for process management. Further, this can contribute to simplification of steps as compared with the case where the wiring structure is formed for every memory cell area AM and logic cell area AL.

Here, since the polysilicon gate electrode is excellent in reliability, it is widely used as a gate material. As used in the flash memory 100 by way of example, it is extremely useful as, for example, a control gate of a buried NOR type flash memory. The conventional CMP process for exposing the gate top using CMP is assumed to be adopted in the forming process of the polysilicon gate electrode. In such a case, however, there is a risk that polysilicon will be damaged.

Consequently, there is a possibility that the desired performance and reliability of a resulting semiconductor device product cannot be achieved.

In contrast, in the manufacturing method of the semiconductor device S1, according to an embodiment, etching is adopted to expose the gate tops of the dummy polysilicon gate electrodes 210 and 310. This can therefore suppress the damage of polysilicon apprehended in the conventional method by CMP, thereby further contributing to the high performance and high reliability of the semiconductor device S1. Damage to the polysilicon can be prevented in that, even after each polysilicon gate electrode 110 of the flash memory 100 is formed, the gate top thereof is not exposed in post-process CMP.

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A method for manufacturing a semiconductor device having a memory cell area and a logic cell area, comprising:
   preparing a silicon substrate;
   forming a polysilicon gate electrode in the memory cell area;
   forming a dummy polysilicon gate electrode in the logic cell area;
   removing the dummy polysilicon gate electrode from the logic cell area;
   forming a gate insulation film and a metal gate electrode having a recess portion, in place of the removed dummy polysilicon gate electrode;
   forming contact holes on source regions and drain regions of the memory cell area and the logic cell area;
   filling the recess portion of the metal gate electrode and the contact holes concurrently with a wiring metal; and
   planarizing the wiring metal by polishing.

2. The method of claim 1, wherein the removing the dummy polysilicon gate electrode comprises exposing the gate top surfaces of the dummy polysilicon gate electrode by etching.

3. The method of claim 1, wherein the memory cell area comprises a plurality of flash memory cells.

4. The method of claim 1, wherein the logic cell area comprises a plurality of negative-channel metal-oxide-semiconductor field-effect transistors (NMOSFET).

5. The method of claim 1, wherein the logic cell area comprises a plurality of positive-channel metal-oxide-semiconductor field-effect transistors (PMOSFET).

6. The method of claim 1, wherein the forming the gate insulation film and the metal gate electrode comprises utilizing at least one of a chemical vapor deposition (CVD) method, an atomic layer deposition (ALD) method, or a physical vapor deposition (PVD) method.

7. The method of claim 1, wherein the gate insulation film comprises a thickness less than approximately 3 nm.

8. The method of claim 1, wherein the metal gate electrode comprises a thickness less than approximately 5 nm.

9. The method of claim 1, further comprising:
   depositing a barrier metal film.

10. The method of claim 9, wherein the depositing the barrier film is performed prior to the filling the recess portion of the metal gate electrode and the contact holes with the wiring metal.

11. The method of claim 1, wherein the planarizing the wiring metal causes a top surface of the metal gate electrode to be higher than a top surface of the polysilicon gate electrode.

* * * * *